United States Patent [19]

Simon

[11] Patent Number: 4,531,468

[45] Date of Patent: Jul. 30, 1985

[54] TEMPERATURE/PRESSURE COMPENSATION STRUCTURE

[75] Inventor: James F. Simon, Portsmouth, R.I.

[73] Assignee: Raytheon Company, Lexington, Mass.

[21] Appl. No.: 624,810

[22] Filed: Jun. 27, 1984

Related U.S. Application Data

[63] Continuation of Ser. No. 337,194, Jan. 5, 1982, abandoned.

[51] Int. Cl.[3] ....................... F42B 19/00; H01L 41/04

[52] U.S. Cl. .................................... 114/21 A; 114/22; 367/167; 367/172

[58] Field of Search ................ 114/20 R, 21 R, 21 A, 114/22, 25, 312, 330, 331, 333; 367/166, 167, 171, 172

[56] References Cited

U.S. PATENT DOCUMENTS

| | | | |
|---|---|---|---|
| 2,490,595 | 12/1949 | Merten | 367/171 X |
| 2,977,573 | 3/1961 | Mott | 367/172 X |
| 2,978,669 | 4/1961 | Harris | 367/172 X |
| 2,978,672 | 4/1961 | Barney | 367/172 X |
| 3,005,974 | 10/1961 | Northrup et al. | 114/20 R X |
| 3,803,544 | 4/1974 | Wallen et al. | 367/172 |
| 3,813,744 | 6/1974 | Morris | 367/166 X |
| 3,882,808 | 5/1975 | Francois et al. | 114/20 R |
| 3,891,871 | 6/1975 | Henriquez et al. | 367/166 X |
| 3,947,709 | 3/1976 | Waltman | 367/172 X |
| 4,187,796 | 2/1980 | Ess | 114/333 X |

*Primary Examiner*—David H. Brown
*Assistant Examiner*—John E. Griffiths
*Attorney, Agent, or Firm*—Martin M. Santa; Joseph D. Pannone; Richard M. Sharkansky

[57] ABSTRACT

A bladder shaped to conform to the form of the sonar transducer housing of a torpedo in which it is located compensates for volume changes because of temperature changes of the oil which fills the transducer housing. The bladder also compensates for the change in water pressure produced by the depth at which the torpedo is operating. The bladder is sufficiently stiff so that it maintains a predetermined shape substantially midway between its fully extended and fully compressed position during the time that the housing is air evacuated and then filled with oil at near atmospheric pressure. The bladder is thus capable of expanding or contracting to accommodate changes in the volume of the contained oil as the temperature of the oil changes. The bladder is preferably made of a material without substantial spring force or stretch.

4 Claims, 5 Drawing Figures

TEMPERATURE/PRESSURE COMPENSATION STRUCTURE

This application is a continuation of application Ser. No. 337,194, filed Jan. 5, 1982, now abandoned.

BACKGROUND OF THE INVENTION

This invention relates to a temperature/pressure compensated expansion chamber and more particularly to a chamber containing a fluid and a flexible volume compensation structure where the structure is sufficiently rigid to withstand the pressure of the fluid without collapsing. The invention is further characterized as a structure for compensating for the change in pressure of the depth of water in which the container may be immersed and the temperature of the container.

This invention is particularly adapted to be used in a sonar transducer array housing which is subject to extreme changes in temperature and to changes in depth of water in which the housing is submerged.

SUMMARY OF THE INVENTION

A bladder shaped to conform to the form of the sonar transducer housing of a torpedo in which it is located compensates for volume changes because of temperature changes of the oil which fills the transducer housing. The bladder also compensates for the change in water pressure produced by the depth at which the torpedo is operating. The bladder is sufficiently stiff so that it maintains a predetermined shape substantially midway between its fully extended and fully compressed position during the time that the housing is air evacuated and then filled with oil at near atmospheric pressure. The bladder is thus capable of expanding or contracting to accommodate changes in the volume of the contained oil as the temperature of the oil changes. The bladder is preferably made of a material without substantial spring force or stretch.

BRIEF DESCRIPTION OF THE DRAWINGS

The aforementioned aspects and other features of the invention are presented in the following description taken in conjunction with the accompanying drawings, wherein.

DESCRIPTION OF THE PREFERRED EMBODIMENT

Figure 1:
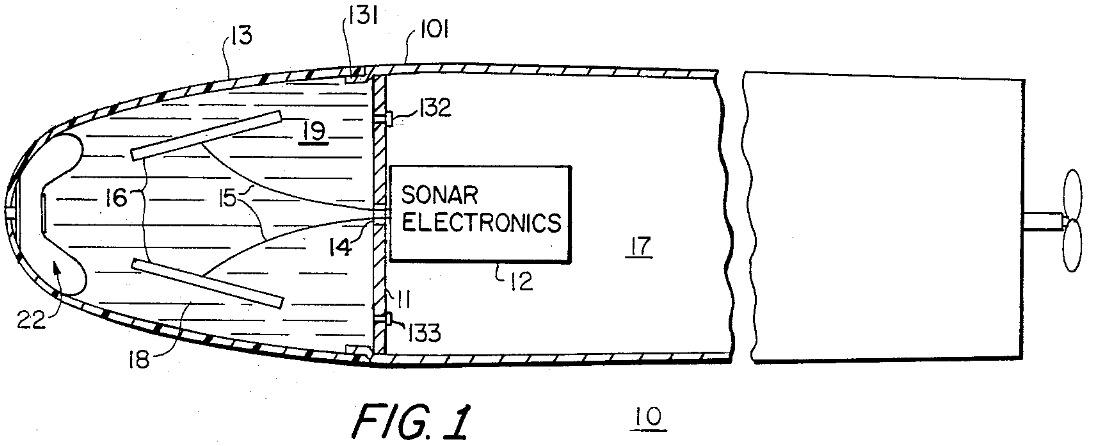
FIG. 1 is a cross-sectional view of a torpedo showing the preferred disposition of the inventive device within the torpedo.

Referring now to FIG. 1, there is shown in longitudinal cross-section a torpedo 10 having a bulkhead 11 which separates the sonar electronics 12 from the oil filled transducer housing 13. The bulkhead 11 is provided with a seal 14 through which wires 15 from the transducers 16 are connected to the sonar electronics 12. The bulkhead 11 and the seal 14 provides an oil-and-water tight compartment 17 within the body of the torpedo 10 in which the sonar electronics and other control and operating circuitry of the torpedo are contained. The transducer housing 13 is attached to the body of the torpedo 10 by a suitable seal 131 which also prevents the oil 18 within the housing 13 from escaping at the seal 131. Such sealing and attaching techniques are well known to those skilled in the art. The forward part of the interior of the housing 13 contains the pressure compensation bladder assembly 22 of this invention.

Figure 3:
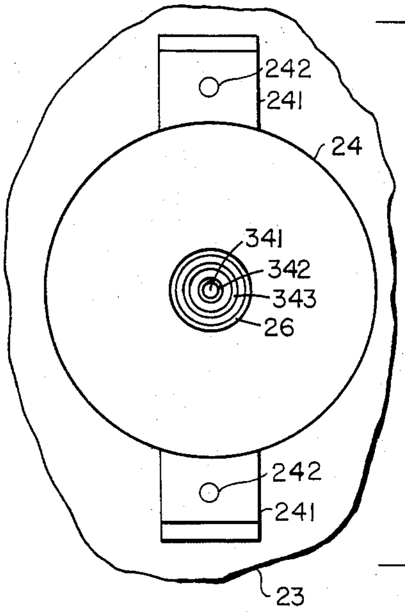
FIG. 3 is an end view of FIG. 2.
Figure 2:
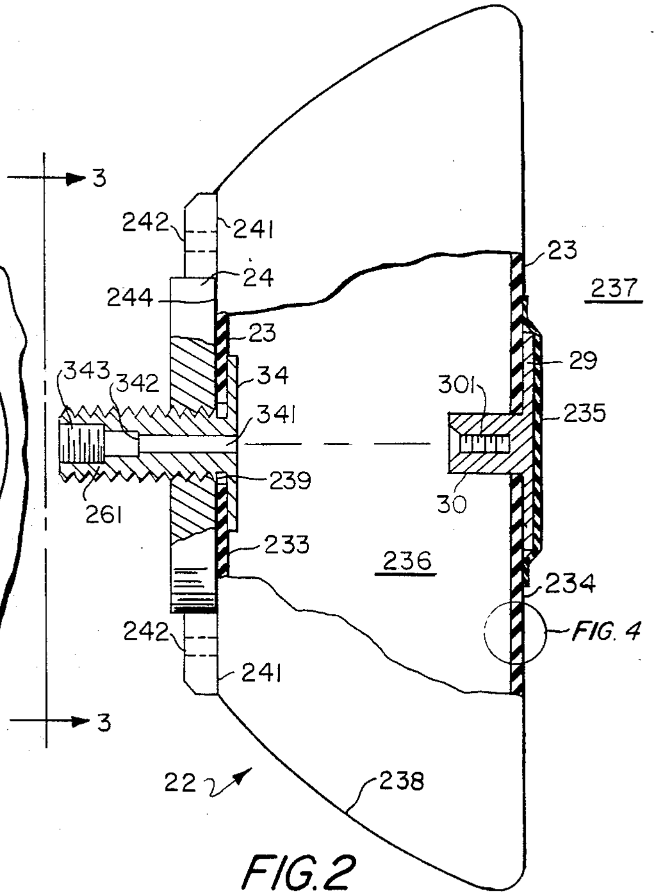
FIG. 2 is a cross-sectional view of the distended bladder assembly of the invention.
Figure 4:
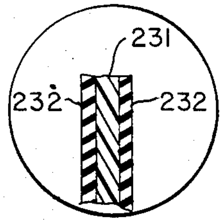
FIG. 4 is a sectional view of the wall of the bladder.

FIG. 2 shows a detailed partial cross-sectional view and FIG. 3 shows a partial front view along view line 3 of the bladder assembly 22. The bladder 23 is typically constructed of a layer 231 of nylon bonded between two sheets of butyl rubber 232 as shown in the detail of FIG. 4. The front wall 233 of bladder 23 has an aperture 239 and is bonded to plate 24 by a suitable cement, 244 typically an epoxy, secured to and also internally threaded plate 24 by an externally threaded stud 261 of flange 34. Plate 24, as shown in FIG. 3, has a pair of oppositely disposed projections 241 having holes 242 diametrically opposed and adapted for use with a spanner wrench (not shown). Flange 34 has a longitudinal hole 341 having a shoulder 342 and an internally threaded end portion 343. The back wall 234 of bladder 23 is bonded and sealed, typically by a suitable epoxy, to a internally threaded studded flange 29 having an internally threaded stud 30. A rubber disk 235 covers the otherwise exposed portion of flange 29 and is attached to the back wall 234 of bladder 23 by a suitable rubber cement to further seal the interior 236 of bladder 23 from its exterior 237. The longitudinal axis of the hole 341 and the threaded hole 301 are coaxial.

Figure 5:
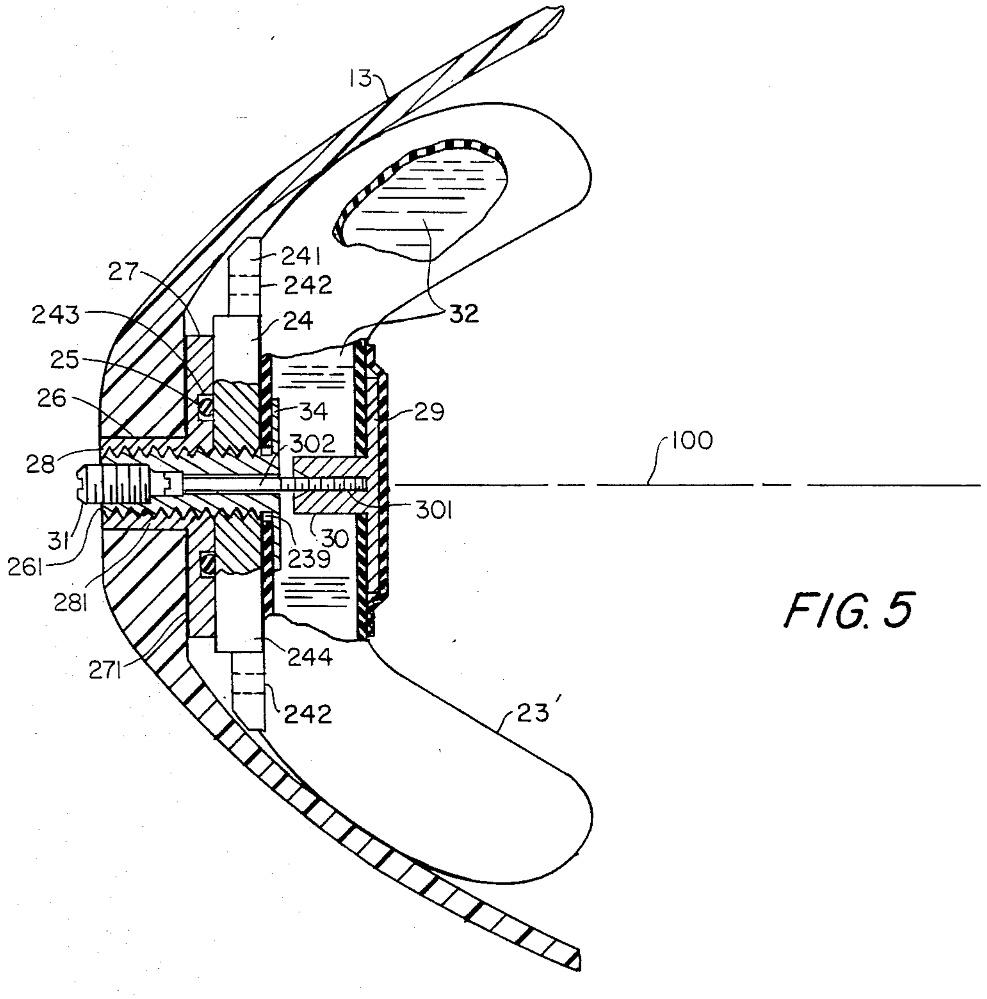
FIG. 5 is a cross-sectional view of the bladder assembly mounted within the torpedo nose cone.

The housing 13 forms the nose cone of the torpedo 10. The housing 13, shown in cross-section in FIG. 5, is typically made of a glass fiber-resin composition. The housing 13 has a hole 26 concentric with the longitudinal axis 100 of the torpedo. A metal, internally threaded, studded flange 27, typically stainless steel, having an internally threaded hole 28 in its stud 281 concentric with hole 26 is attached to the fiberglass housing 13 by a suitable adhesive 271, typically an epoxy. An annular groove 243 in flange 27 provides a seat for an annular gasket 25.

The bladder 23 is attached to the housing 13 by a screwing plate 24 and threaded flange 34 into the threaded hole 28 of plate flange 27. The gasket 25 when compressed by a spanner wrench engaging holes 242 and being tightened provides an oil seal between the housing 13 and the interior 236 of the bladder 23.

The bladder 23 prior to being secured to the housing 13, has its initial volume, shown in FIG. 2, reduced approximately 50% by pulling the back wall 234 of bladder 23 inwardly by means of preload screw 302 whose threaded end engages the threaded hole 301 as shown in FIG. 5. Either the length of screw 302 or the height of stud 30 can determine the degree to which the volume of bladder 23 is decreased. The compressed bladder 23' is then completely filled with water 32 prior to being sealed closed by cap screw 31 which may be wound with Teflon tape to make the closure watertight. The compressed bladder 23' is now ready for attachment to the interior of the enclosure 13 prior to housing 13 forming the torpedo nose cone by being sealed to torpedo body 101.

Attachment of the bladder 23 to the housing 13 is accomplished by inserting a spanner wrench into holes 242 and screwing stud 261 of studded flange 34 and plate 24 into threaded hole 28 of flange 27. A commercially available locking solution (not shown) may be applied to threaded hole 28 to secure the attachment. Sufficient force is applied to plate 24 to compress the annular gasket 25 to provide a seal.

The housing 13, containing the compressed bladder as shown in FIG. 5, is next attached and sealed to the torpedo body 101 to provide an enclosed region 19. Using conventional filling techniques, the enclosed region 19 is evacuated of air through valve 132 which penetrates the bulkhead 11. A suitable oil 18 is allowed to completely fill the evacuated region 19 through valve 133 until it starts to flow from valve 132 after which the valves 132 and 133 are closed. It is seen that filling the compressed bladder 23' with water has prevented shape change of bladder 23' and the preload screw 302 and cap screw 31 have prevented volume change during the evacuation and oil filling procedure. After filling region 19 with oil 18, the cap screw 31 and the preload screw 302 are removed and the water 32 is allowed to flow out. The material from which the bladder is constructed is sufficiently stiff to hold its shape under the pressure of the atmosphere which enters the interior 236 of the bladder through hole 341. The nylon layer 231 contained between the sheets of butyl rubber 232 provides the necessary tension member to prevent over expansion of bladder 23 during the filling operation. The pressure produced on back wall 234 and peripheral wall 238 of bladder 23 by the oil 18 is opposed by the vacuum produced in the air tight region 19 during the filling operation. Therefore, the bladder will not collapse when the cap screw 31, the preload screw 302 and the water 32 is removed after filling region 19 with oil 18.

In operation, the oil filled housing 13 may experience substantial changes in the temperature, heat and cold, of the oil 18 because of the environment in which the torpedo may be used. However, the bladder 23, when preset as described, is sufficiently flexible that extreme temperature changes produce very little pressure change within the enclosure 13 because the bladder 23 expands or compresses due to the change in oil volume due to the temperature of the oil to maintain the pressure substantially at atmospheric pressure. In the event the torpedo is immersed in the water, the water enters the interior 236 of the bladder 23 through hole 341 and applies pressure to the oil 18 through the bladder's walls 238 and 234 so that the pressure on the inside and the outside of the enclosure 13 is substantially equal and therefore the enclosure 13 does not experience substantial pressure differential from its exterior to its interior.

Having described a preferred embodiment of the invention it will now be apparent to one of skill in the art that other embodiments incorporating its concept may be used. It is felt, therefore, that this invention should not be restricted to the disclosed embodiment but rather should be limited only by the spirit and scope of the appended claims.

I claim:

1. A transducer housing with temperature/pressure compensation attached as a nose cone of a torpedo comprising:

a housing;

a bladder having a front wall, a back wall, and an aperture means and filling a portion of said housing;

first mechanical means attached to and deforming said bladder to cause it to have a deformed volume less than its nondeformed volume, said first mechanical means contacting said bladder front and back walls and operable to pull said back wall towards said front wall;

a first liquid;

said deformed volume bladder filled with said first liquid;

a second liquid;

said second liquid being within a remainder portion of said housing not occupied by said first-liquid-filled deformed volume bladder;

second mechanical means substantially maintaining the deformed shape of said bladder by sealing said first liquid within said deformed bladder;

said housing having a first and second hole providing means;

means providing a seal between said bladder and said housing first hole providing means to prevent the escape of said second liquid from said housing;

means for sealing said second hole providing means and for filling said housing not occupied by said deformed bladder with said second liquid;

said first and second mechanical means adapted to allow release of said first liquid from said deformed bladder;

said bladder being made of a material sufficiently stiff to maintain its deformed shape upon removal of said second mechanical means, removal of a portion of said first mechanical deforming means and release of said first liquid from said deformed bladder; and a transducer totally immersed in said second liquid filled remainder portion of said housing.

2. The housing of claim 1 wherein said first mechanical means comprises:

an internally threaded studded flange attached to said back wall of said bladder;

a plate attached to the front wall of said bladder;

a second studded flange having an externally threaded stud;

said plate being threadedly attached to said externally threaded stud of said second studded flange;

said stud having a hole extending through said second studded flange;

a screw which is said portion of said first mechanical means and is rotatably mounted within said hole and engaging the first threaded studded flange thereby pulling said front wall and back wall toward each other thereby deforming said bladder when said screw is screwed into said first flange.

3. The housing of claim 2 comprising in addition;

said externally threaded stud of said second studded flange also having an internally threaded end portion of said hole;

wherein said second mechanical means for maintaining the deformed shape of said bladder comprises:

a cap screw;

said cap screw being screwed into said internally threaded end portion of said second studded flange to seal said first liquid within said bladder.

4. A temperature/pressure compensated fluid-filled transducer housing attached as a nose cone of a torpedo comprising:

a housing having an interior and a plurality of openings to said interior;

a flexible bladder, said bladder being contained within the interior of said housing, said bladder having a front wall, a back wall, and an aperture means, and said bladder occupying a predetermined volume when exposed to equal pressure on its interior and its exterior;

mechanical means attached to said bladder reducing the volume of said bladder to a reduced volume less than said predetermined volume, said mechanical means contacting said bladder front and back walls and operable to pull said back wall towards said front wall;

a first and second fluid;

said mechanical means including means for filling said reduced volume bladder with said first fluid extending through one of said openings;

means for sealing said first fluid in said reduced volume, to provide a sealed first-fluid-filled bladder;

means for filling said housing with said second fluid when said sealed first-fluid-filled bladder has said reduced volume and for sealing said housing to provide a sealed second-fluid-filled housing;

a transducer totally immersed within said second-fluid-filled housing;

said mechanical means being adapted upon removal of said means for sealing said first fluid in said bladder and removal of a portion of said mechanical means to allow said first liquid to exit said bladder to provide an empty, deformed bladder;

said empty, deformed bladder being substantially the same shape as that of said first-fluid-filled bladder;

whereby said second fluid-filled housing changes second fluid volume with change in temperature to maintain substantially constant pressure of said second fluid and whereby said bladder transfers the pressure of the environment outside said housing into and across said bladder to the interior of the sealed second-fluid-filled housing.

* * * * *